(12) United States Patent
Jeong

(10) Patent No.: US 11,119,537 B2
(45) Date of Patent: Sep. 14, 2021

(54) FOLDABLE DISPLAY DEVICE INCLUDING PROTECTION FILM

(71) Applicant: SAMSUNG DISPLAY CO., LTD., Yongin-Si (KR)

(72) Inventor: Gyeongho Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/590,740

(22) Filed: Oct. 2, 2019

(65) Prior Publication Data

US 2020/0159287 A1    May 21, 2020

(30) Foreign Application Priority Data

Nov. 20, 2018   (KR) ......................... 10-2018-0143740

(51) Int. Cl.

| | | |
|---|---|---|
| *G06F 1/16* | (2006.01) | |
| *G09F 9/30* | (2006.01) | |
| *H01L 51/00* | (2006.01) | |
| *H01L 51/52* | (2006.01) | |

(52) U.S. Cl.
CPC .......... *G06F 1/1652* (2013.01); *G06F 1/1656* (2013.01); *G09F 9/301* (2013.01); *H01L 51/0097* (2013.01); *H01L 51/5284* (2013.01); *H01L 51/5253* (2013.01)

(58) Field of Classification Search
CPC ...... G06F 1/1652; G06F 1/1656; G09F 9/301; H01L 51/0097; H01L 51/5284; H01L 51/5253; H01L 2251/5338; H01L 2251/558; G02F 1/133305; H04M 1/0268; H05K 1/028
See application file for complete search history.

(56) References Cited

U.S. PATENT DOCUMENTS

| | | | |
|---|---|---|---|
| 2015/0210588 A1 | 7/2015 | Chang et al. | |
| 2015/0351232 A1* | 12/2015 | Cok | ...................... H05K 1/0274 156/204 |
| 2016/0268523 A1* | 9/2016 | Kim | ...................... H01L 51/529 |
| 2017/0025634 A1* | 1/2017 | Jeong | ..................... G06F 1/1652 |

(Continued)

FOREIGN PATENT DOCUMENTS

| | | | |
|---|---|---|---|
| JP | 05265196 A | * 10/1993 | ............... G03F 1/60 |
| JP | 2016-164626 A | 9/2016 | |

(Continued)

OTHER PUBLICATIONS

EPO Extended Search Report dated Apr. 23, 2020, for corresponding European Patent Application No. 19210351.3 (10 pages).

*Primary Examiner* — James Wu
(74) *Attorney, Agent, or Firm* — Lewis Roca Rothgerber Christie LLP

(57) ABSTRACT

A display device includes a display module, a protection film, and a complementary film. The display module is foldable with respect to a first bending axis and a second bending axis spaced apart from the first bending axis. The protection film is below the display module, overlaps the first bending axis and the second bending axis, and includes a polymer material. The complementary film is below the protection film, overlaps only the second bending axis of the first and second bending axes, and includes a metal.

21 Claims, 13 Drawing Sheets

(56) References Cited

U.S. PATENT DOCUMENTS

| | | |
|---|---|---|
| 2017/0155084 A1 | 6/2017 | Park et al. |
| 2017/0171939 A1 | 6/2017 | Yang et al. |
| 2018/0145269 A1 | 5/2018 | Myeong et al. |
| 2018/0190632 A1 | 7/2018 | Bibl et al. |
| 2018/0203483 A1 | 7/2018 | Kwak et al. |

FOREIGN PATENT DOCUMENTS

| | | |
|---|---|---|
| JP | 10-2017-0012739 A | 2/2017 |
| KR | 10-2017-0069775 A | 6/2017 |
| KR | 10-2018-0085627 A | 7/2018 |

\* cited by examiner

FOLDABLE DISPLAY DEVICE INCLUDING PROTECTION FILM

CROSS-REFERENCE TO RELATED APPLICATION

This patent application claims priority to and the benefit of Korean Patent Application No. 10-2018-0143740, filed on Nov. 20, 2018 in the Korean Intellectual Property Office, the entire content of which is herein incorporated by reference.

BACKGROUND

1. Field

Aspects of embodiments of the present disclosure relate to display device.

2. Description of the Related Art

A display device displays various images on a display screen to provide information to a user. In general, the display device displays information within an allocated screen. In recent years, flexible display devices including a foldable flexible display panel have been developed. The flexible display device may be folded, rolled, or bent, unlike a rigid display device. The flexible display device, which is variously changeable in shape, may be carried regardless of a typical screen size, and, thus, user convenience may be improved.

Since a stress is repeatedly applied to a folded portion of the display device, the folded portion may be damaged.

SUMMARY

According to an aspect of embodiments of the present disclosure, a display device in which a folded portion has improved durability is provided. According to another aspect of embodiments of the present disclosure, a multi-foldable display device having improved durability is provided.

According to one or more embodiments of the inventive concept, a display device includes a display module, a protection film, and a complementary film. The display module is foldable with respect to a first bending axis and a second bending axis spaced apart from the first bending axis. The protection film is below the display module, overlapping the first bending axis and the second bending axis, and includes a polymer material. The complementary film is below the protection film, overlapping only the second bending axis of the first and second bending axes, and includes a metal.

In an embodiment, the display device may be in-foldable with respect to the first bending axis, and in-foldable and out-foldable with respect to the second bending axis.

In an embodiment, the display device may further include a light blocking layer. The light blocking layer may be between the display module and the protection film, overlap the first bending axis and the second bending axis, and have a black color.

In an embodiment, the light blocking layer may contact the display module and the protection film.

In an embodiment, the display device may further include a cover layer below the complementary film to cover the complementary film.

In an embodiment, the display device may further include an impact absorbing member below the protection film and having elasticity.

In an embodiment, the impact absorbing member may include: a first impact absorbing member that does not overlap the complementary film and has a first thickness; and a second impact absorbing member that overlaps the complementary film and has a second thickness less than the first thickness.

In an embodiment, the display device may further include an adhesive member configured to couple the first impact absorbing member to the first protection film and the second protection film and couple the second impact absorbing member to the cover layer.

In an embodiment, the display module may include a first display area, a second display area extending from the first display area, and a third display area extending from the first display area. The first bending axis may be defined between the first display area and the second display area, and the second bending axis may be defined between the first display area and the third display area.

In an embodiment, the display device may further include a support member below the impact absorbing member. The support member may include: a first support member overlapping the first display area; a second support member overlapping the second display area and being spaced apart from the first support member; and a third support member overlapping the third display area and being spaced apart from the first support member.

In an embodiment, the protection film may have a thickness of about 50 μm or more and about 100 μm or less, the light blocking layer may have a thickness of about 5 μm or more and about 8 μm or less, the complementary film may have a thickness of about 30 μm or more and about 50 μm or less, and the cover layer may have a thickness of about 3 μm or more and about 5 μm or less.

In an embodiment, a first curvature radius generated when folded with respect to the first bending axis may be less than a second curvature radius generated when folded with respect to the second bending axis.

According to one or more embodiments of the inventive concept, a display device includes: a display module on which a plurality of bending axes is defined and which is foldable with respect to each of the plurality of bending axes; and a base film below the display module.

In an embodiment, the base film includes: a first portion that overlapping a first bending axis of the plurality of bending axes and having a first thickness; and a second portion overlapping a second bending axis of the plurality of bending axes and having a second thickness greater than the first thickness.

In an embodiment, the first portion may include a first protection film including a polymer material. The second portion may include: a second protection film including the polymer material and extending from the first protection film; and a complementary film including a metal, not overlapping the first bending axis, and overlapping the second bending axis.

BRIEF DESCRIPTION OF THE FIGURES

The accompanying drawings are included to provide a further understanding of the inventive concept, and are incorporated in and constitute a part of this specification. The drawings illustrate some example embodiments of the inventive concept and, together with the description, serve to explain principles of the inventive concept. In the drawings.

DETAILED DESCRIPTION

Figure 1:
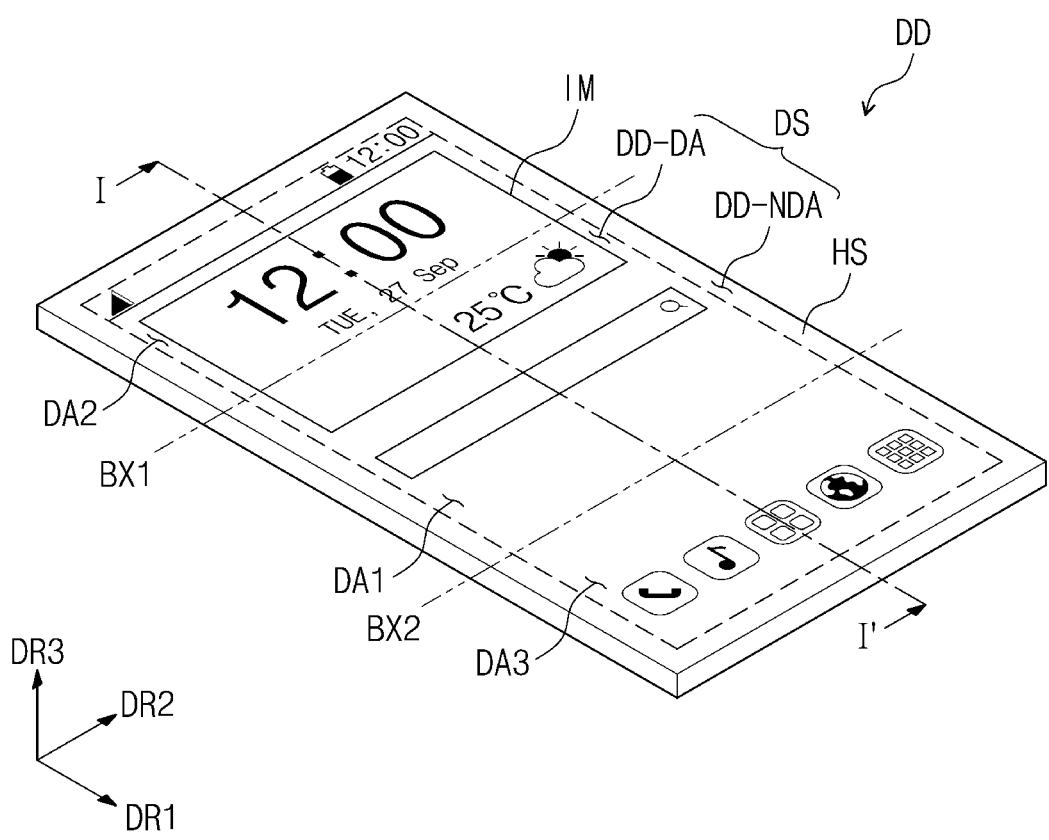
FIG. 1 is a perspective view illustrating a display device according to an embodiment of the inventive concept.

Herein, some example embodiments of the inventive concept will be described with reference to the accompanying drawings.

Also, in the figures, the thickness, ratio, and dimensions of components may be exaggerated for clarity of illustration. As used herein, the term "and/or" includes any and all combinations of one or more of the associated listed items.

The meaning of "include" or "comprise" specifies a property, a fixed number, a step, an operation, an element, a component, or a combination thereof, but does not exclude other properties, fixed numbers, steps, operations, elements, components, or combinations thereof.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a display device DD according to an embodiment of the inventive concept. As illustrated in FIG. 1, a display surface DS on which an image IM is displayed is parallel to a plane defined by a first directional axis DR1 and a second directional axis DR2. A normal direction of the display surface DS, i.e., a thickness direction of the display device DD, indicates a third directional axis DR3. A front surface (or top surface) and a rear surface (or bottom surface) of each of members is distinguished by the third directional axis DR3. However, directions indicated by the first to third directional axes DR1, DR2, and DR3 may be relative concepts, and thus converted with respect to each other. Herein, first to third directions may be directions indicated by the first to third directional axes DR1, DR2, and DR3 and designated by the same reference numerals, respectively.

The display device DD according to an embodiment of the inventive concept may be a foldable display device. The display device DD according to an embodiment of the inventive concept may be used for large-sized electronic devices, such as televisions and monitors, and small and medium-sized electronic devices, such as mobile phones, tablet PCs, navigation units for vehicles, game consoles, and smart watches.

As illustrated in FIG. 1, the display surface DS of the display device DD may include a plurality of areas. The display device DD includes a display area DD-DA on which the image IM is displayed and a non-display area DD-NDA disposed adjacent to the display area DD-DA. The non-display area DD-NDA may be an area on which an image is not displayed. FIG. 1 illustrates icons and a clock window of an application as an example of the image IM. In an embodiment, the display area DD-DA may have a rectangular shape, and the non-display area DD-NDA may surround the display area DD-DA. However, embodiments of the inventive concept are not limited thereto. For example, the display area DD-DA and the non-display area DD-NDA may be variously designed in shape.

In an embodiment, the display area DD-DA may include a first display area DA1, a second display area DA2, and a third display area DA3.

The first display area DA1 may be disposed between the second display area DA2 and the third display area DA3. Each of the second display area DA2 and the third display area DA3 may extend from the first display area DA1.

A first bending axis BX1 may be defined between the first display area DA1 and the second display area DA2. A second bending axis BX2 may be defined between the first display area DA1 and the third display area DA3. The first bending axis BX1 and the second bending axis BX2 may be spaced apart from each other.

Although two bending axes BX1 and BX2 are exemplarily illustrated in FIG. 1, embodiments of the inventive concept are not limited thereto. For example, the number of the bending axes may be changed as necessary.

The display device DD may include a housing HS. The housing HS may be disposed at an outer portion of the display device DD and accommodate components therein.

FIGS. 2A to 2E are views exemplarily illustrating some states in which the display device DD of FIG. 1 is folded.

Figure 2A:
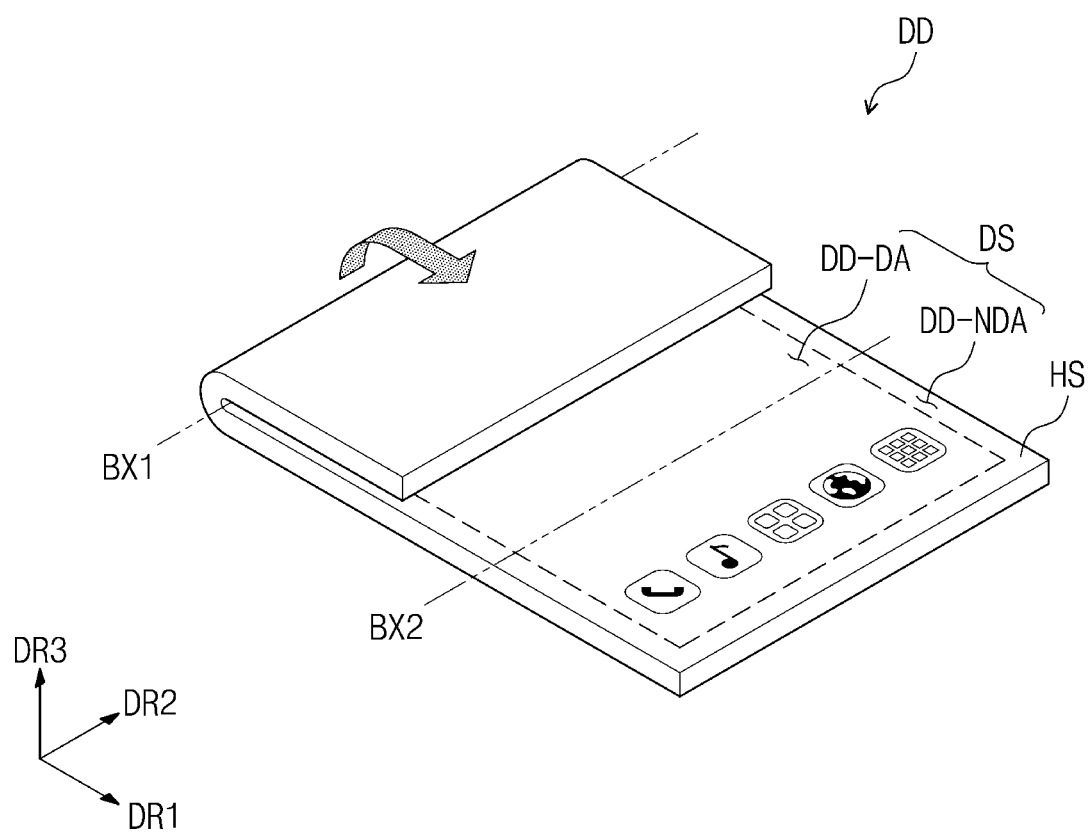
FIGS. 2A to 2E are views illustrating some states in which the display device of FIG. 1 is folded.

Referring to FIG. 2A, the display device DD may be in-folded with respect to the first bending axis BX1. In an embodiment of the inventive concept, the display device DD may be only in-folded and may not be out-folded with respect to the first bending axis BX1.

In this specification, a term of in-folding may represent a state in which the display area DD-DA is folded to face itself, and a term of out-folding may represent a state in which the display area DD-DA is folded not to face itself.

Figure 2B:
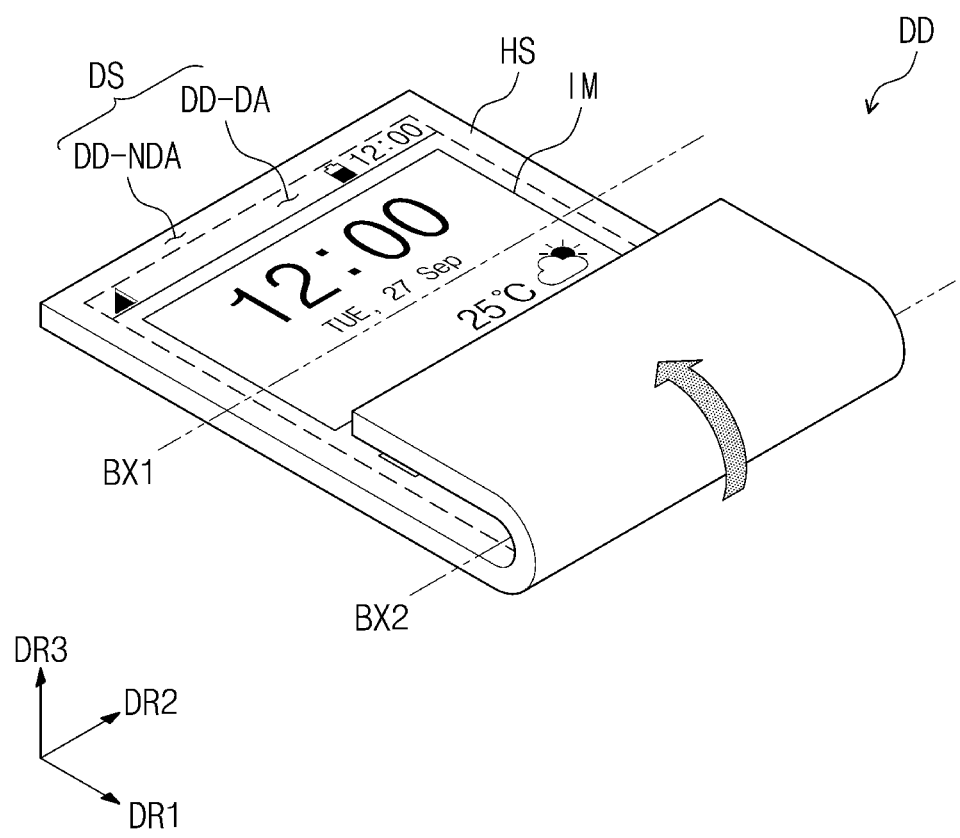
Figure 2C:
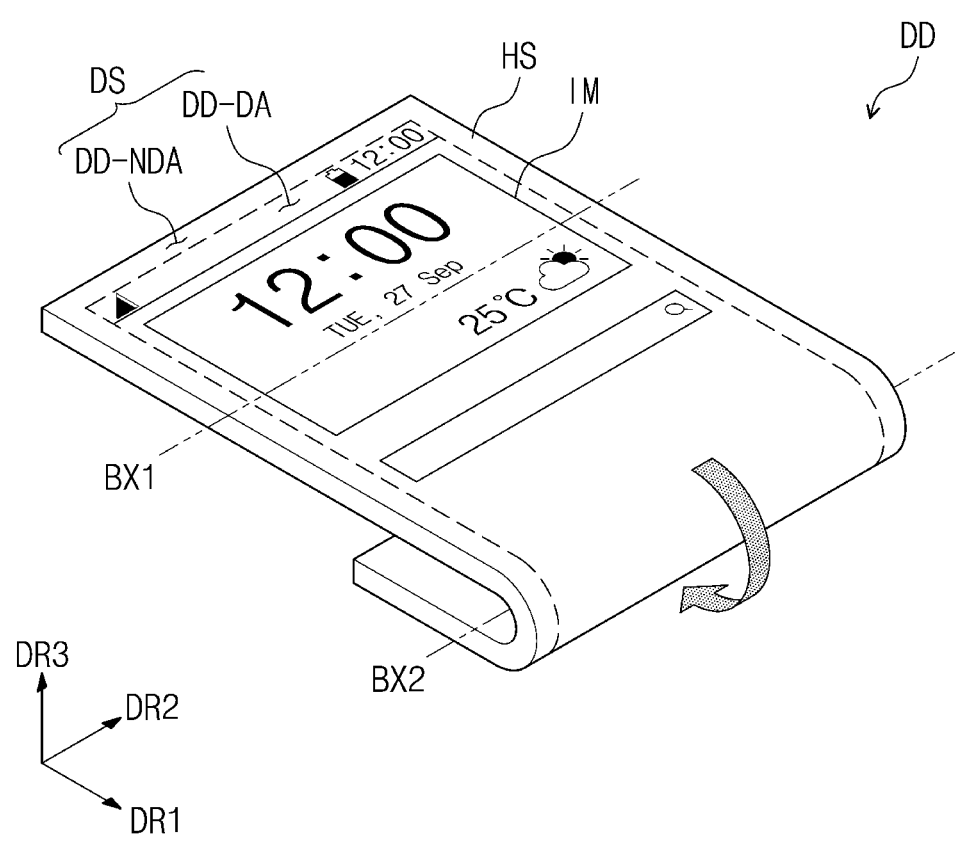

Referring to FIG. 2B, the display device DD may be in-folded with respect to the second bending axis BX2. Referring to FIG. 2C, the display device DD according to an embodiment of the inventive concept may be out-folded with respect to the second bending axis BX2. That is, the display device DD may perform in-folding and out-folding with respect to the second bending axis BX2.

Figure 2D:
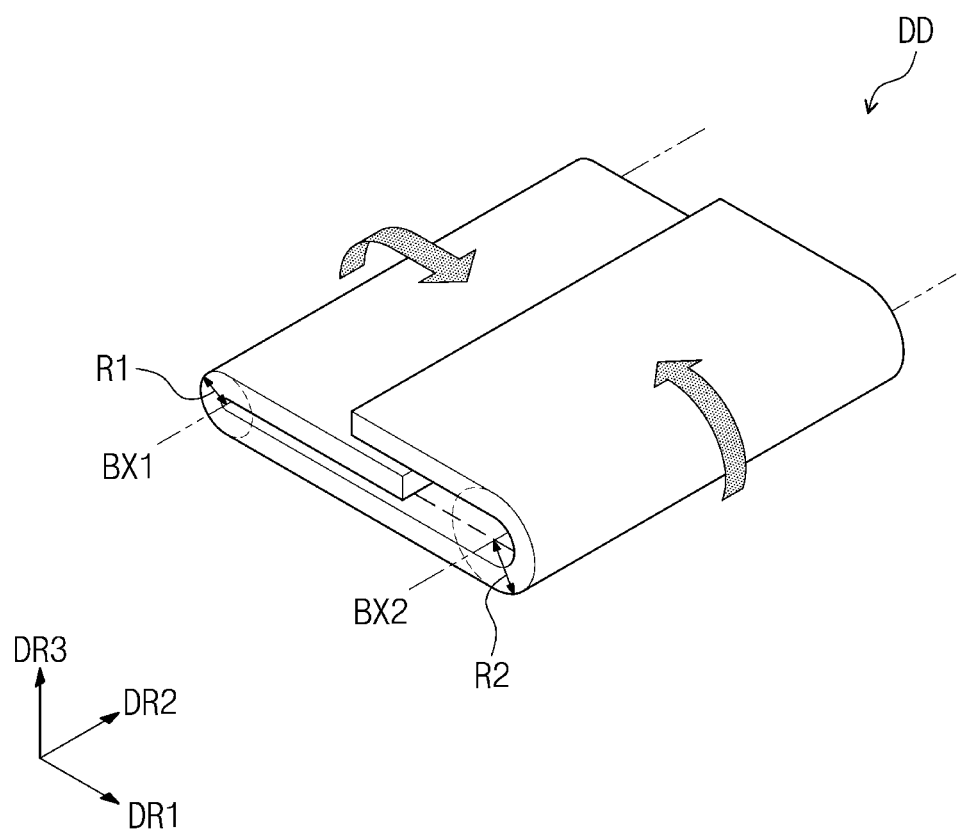

FIG. 2D exemplarily illustrates a state in which the display device DD is in-folded with respect to the first bending axis BX1 and in-folded with respect to the second bending axis BX2.

Figure 2E:
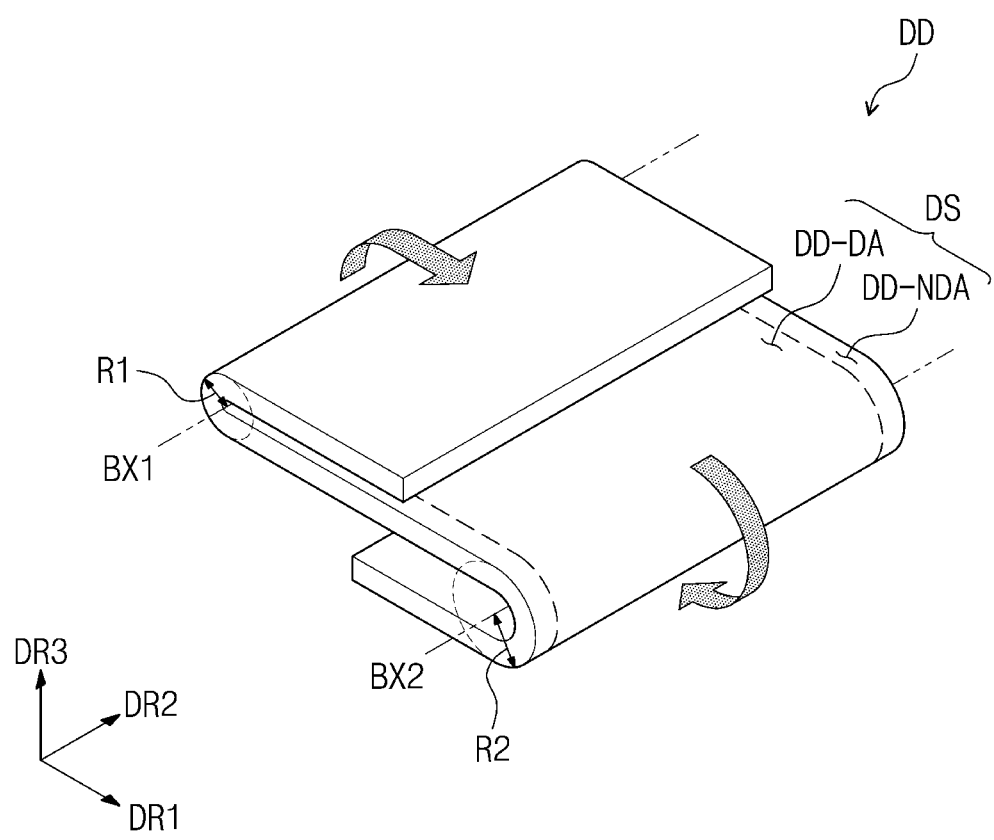

FIG. 2E exemplarily illustrates a state in which the display device DD is in-folded with respect to the first bending axis BX1 and out-folded with respect to the second bending axis BX2.

In an embodiment, referring to FIGS. 2D and 2E, a curvature radius R1 (herein, referred to as a first curvature radius) when the display device DD is bent with respect to the first bending axis BX1 is less than a curvature radius R2 (herein, referred to as a second curvature radius) when the display device DD is bent with respect to the second bending axis BX2.

In an embodiment of the inventive concept, since the display device DD may perform the in-folding and the out-folding with respect to the second bending axis BX2 while being only in-folded with respect to the first bending axis BX1, a stress may be further applied to a portion corresponding to the second bending axis BX2 than a portion corresponding to the first bending axis BX1 in the display device DD. Accordingly, the stress applied to the portion corresponding to the second bending axis BX2 in the display device may be reduced by allowing the second curvature radius R2 to be greater than the first curvature radius R1.

Although some methods of folding the display device DD are exemplarily illustrated in FIGS. 2A to 2E, embodiments of the inventive concept are not limited thereto.

Figure 3:
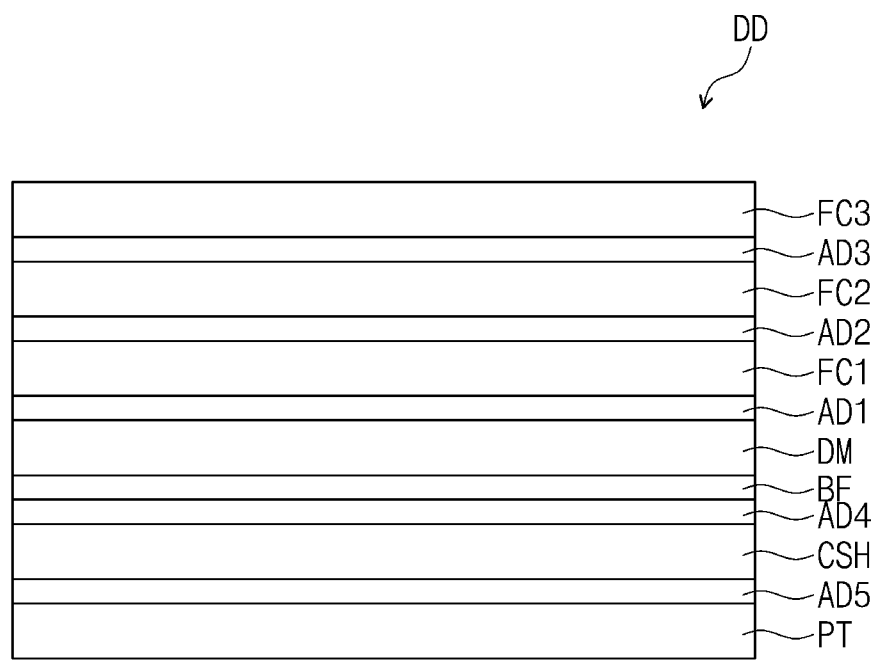
FIG. 3 is a cross-sectional view illustrating a display device according to an embodiment of the inventive concept.
Figure 3:
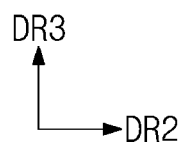
Figure 4A:
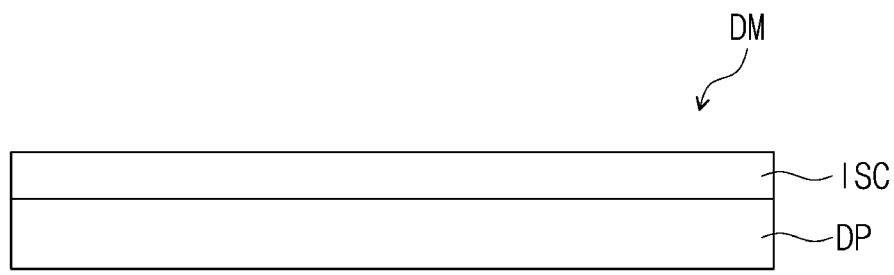
FIGS. 4A and 4B are cross-sectional views illustrating a display module of a display device according to embodiments of the inventive concept.
Figure 4B:
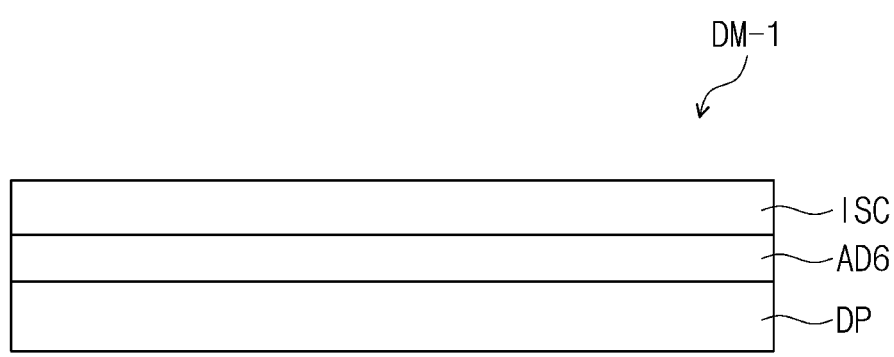

FIG. 3 is a cross-sectional view illustrating the display device DD according to an embodiment of the inventive concept; and FIGS. 4A and 4B are cross-sectional views illustrating a display module DM and DM-1 of the display device DD according to embodiments of the inventive concept. FIG. 3 illustrates a cross-section defined by the second directional axis DR2 and the third directional axis DR3.

In an embodiment, the display device DD may include a display module DM, a plurality of functional layers FC1 to FC3, a base film BF, an impact absorbing member CSH, a support member PT, and a plurality of adhesive members AD1 to AD5.

In an embodiment of the inventive concept, each of the adhesive members AD1 to AD5 (and an adhesive member AD6 described later herein) may be a pressure sensitive adhesive (PSA).

The functional layers FC1 to FC3 may be disposed above the display module DM.

A first functional layer FC1 may be attached to the display module DM by a first adhesive member AD1. A second functional layer FC2 may be attached to the first functional layer FC1 by a second adhesive member AD2. A third functional layer FC3 may be attached to the second functional layer FC2 by a third adhesive member AD3.

Each of the functional layers FC1 to FC3 may include a polymer material. Each of the functional layers FC1 to FC3 may have a film shape. In an embodiment, each of the functional layers FC1 to FC3 may have a modulus of about 2 GPa or more and about 100 GPa or less.

In an embodiment, each of the functional layers FC1 to FC3 may have a thickness of about 35 μm or more and about 60 μm or less. When each of the functional layers FC1 to FC3 has a thickness less than about 35 μm, performance of an originally intended function may be degraded, and when greater than about 60 μm, flexibility of the display device DD may be decreased. In an embodiment of the inventive concept, the first functional layer FC1 may be a polarizing functional layer that polarizes incident light. The second functional layer FC2 may be an impact-absorbing functional layer to absorb an impact applied from the outside. The third functional layer FC3 may be a window functional layer to provide an outer surface of the display device DD. In another embodiment of the inventive concept, one or more of the first to third functional layers FC1 to FC3 may be omitted.

The base film BF, the impact absorbing member CSH, and the support member PT are disposed below the display module DM.

In an embodiment, the base film BF may be directly attached to the display module DM. In an embodiment of the inventive concept, the base film BF may include a plurality of layers.

The impact absorbing member CSH may be attached to the base film BF by a fourth adhesive member AD4. The impact absorbing member CSH may include a polymer material. The impact absorbing member CSH may be a layer for absorbing an impact applied from the outside.

The support member PT may be attached to the impact absorbing member CSH by a fifth adhesive member AD5. The support member PT may support the display module DM. In an embodiment, the support member PT may include a hinge (not shown) for folding or bending the display module DM. The support member PT may have a rigid property. In another embodiment of the inventive concept, the support member PT may be omitted.

Referring to FIG. 4A, in an embodiment, the display module DM may include a display panel DP and an input sensing circuit ISC. The input sensing circuit ISC may detect a touch and/or a pressure applied from the outside.

In an embodiment, the input sensing circuit ISC may be directly disposed on a thin-film encapsulation layer (not shown) of the display panel DP. Here, a feature of being directly disposed represents that the input sensing circuit ISC is disposed on the display panel DP without an additional adhesive member therebetween.

Referring to FIG. 4B, in another embodiment, a display module DM-1 may include a display panel DP, an input sensing circuit ISC, and a sixth adhesive member AD6. The display panel DP and the input sensing circuit ISC may be attached by the sixth adhesive member AD6.

Figure 5:
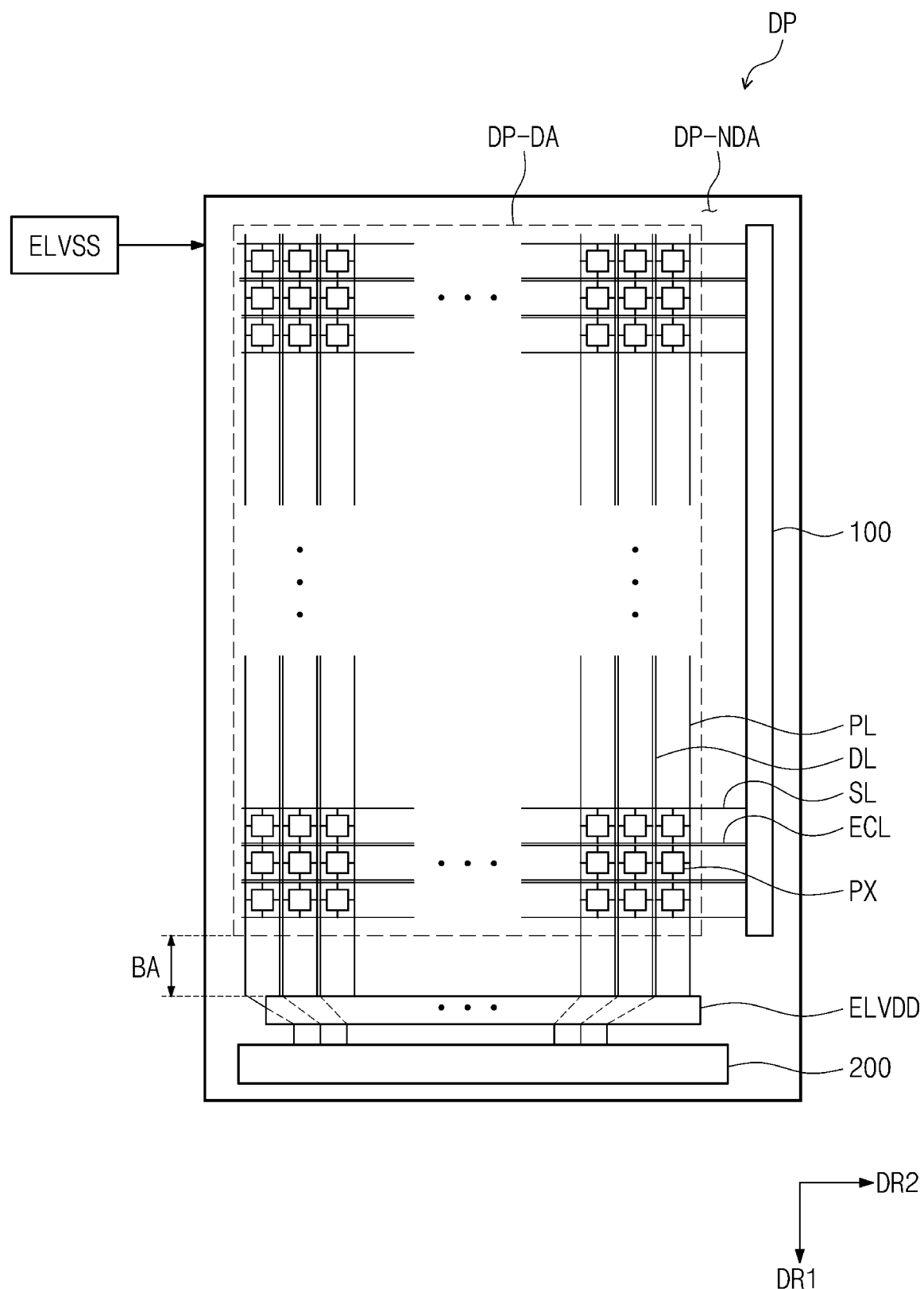
FIG. 5 is a plan view illustrating a display panel according to an embodiment of the inventive concept.

FIG. 5 is a plan view illustrating the display panel DP according to an embodiment of the inventive concept.

The display panel DP includes a display area DP-DA and a non-display area DP-NDA on a plane. In an embodiment, the non-display area DP-NDA may be defined along an edge of the display area DP-DA. The display area DP-DA and the non-display area DP-NDA of the display panel DP may correspond to the display area DD-DA and the non-display area DD-NDA of the display device DD in FIG. 1, respectively.

The display panel DP may include a scan driving unit 100, a data driving unit 200, a plurality of scan lines SL, a plurality of light emitting control lines ECL, a plurality of data lines DL, a plurality of power lines PL, and a plurality of pixels PX (herein, referred to as pixels). The pixels PX are disposed on the display area DP-DA. In an embodiment, each of the pixels PX includes an organic light-emitting diode OLED (refer to FIG. 6) and a pixel circuit CC (refer to FIG. 6) connected thereto.

The scan driving unit 100 may include a scan driving part and a light emitting control driving part.

The scan driving part generates scan signals, and sequentially outputs the generated scan signals to scan lines SL. The light emitting control driving part generates light emitting control signals, and outputs the generated light emitting control signals to light emitting control lines ECL.

In another embodiment of the inventive concept, the scan driving part and the light emitting control driving part may be integrated into one circuit without being divided in the scan driving unit 100.

The scan driving unit 100 may include a plurality of thin-film transistors that are formed through a same process as the driving circuit of each of the pixels PX, e.g., a low temperature polycrystalline silicon (LTPS) process or a low temperature polycrystalline oxide (LTPO) process.

The data driving unit 200 outputs data signals to the data lines DL. The data signals are analog voltages corresponding to gray values of image data.

In an embodiment of the inventive concept, the data driving unit 200 may be directly mounted to the display panel DP. However, embodiments of the inventive concept are not limited thereto. In another embodiment of the inventive concept, the data driving unit 200 may be mounted to a printed circuit board (not shown), and the printed circuit board (not shown) may be connected to pads disposed on one end of the data lines DL.

The scan lines SL may extend in the second direction DR2 and be arranged in the first direction DR1 crossing the second direction DR2. Although the second direction DR2 and the first direction DR1 may be perpendicular to each other in an embodiment of the inventive concept, embodiments of the inventive concept are not limited thereto.

The light emitting control lines ECL may extend in the second direction DR2 and be arranged in the first direction DR1. That is, the light emitting control lines ECL may be arranged in parallel to corresponding scan lines of the scan lines SL, respectively.

The data lines DL may extend in the first direction DR1 and be arranged in the second direction DR2 crossing the first direction DR1. The data lines DL may provide the data signals to the corresponding pixels PX.

The power lines PL may extend in the first direction DR1 and be arranged in the second direction DR2. The power lines PL may provide a first power ELVDD to corresponding pixels PX.

Each of the plurality of pixels PX is connected to a corresponding scan line of the scan lines SL, a corresponding light emitting control line of the light emitting control lines ECL, a corresponding data line of the data lines DL, and a corresponding power line of the power lines PL.

The non-display area DP-NDA of the display panel DP may include a bending area BA. When the display panel DP is bent with respect to the bending area BA, a surface area of the non-display area DP-NDA may be decreased to provide the display device DD having a narrow bezel on a plane defined by the first direction DR1 and the second direction DR2. That is, the display device DD in which the non-display area DD-NDA in FIG. 1 has a small surface area may be provided.

Figure 6:
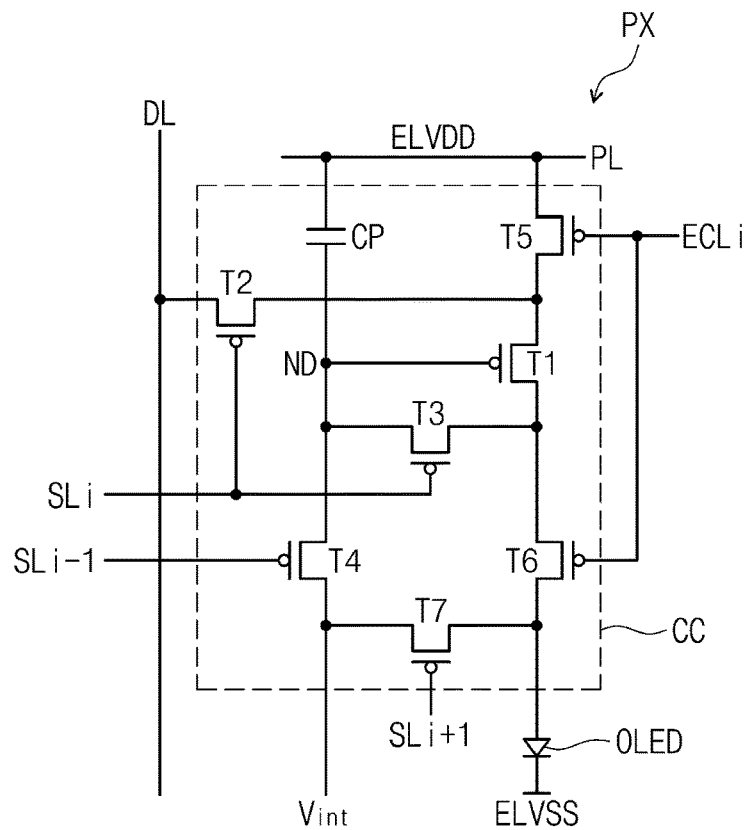
FIG. 6 is an equivalent circuit diagram illustrating a pixel according to an embodiment of the inventive concept.
Figure 7:
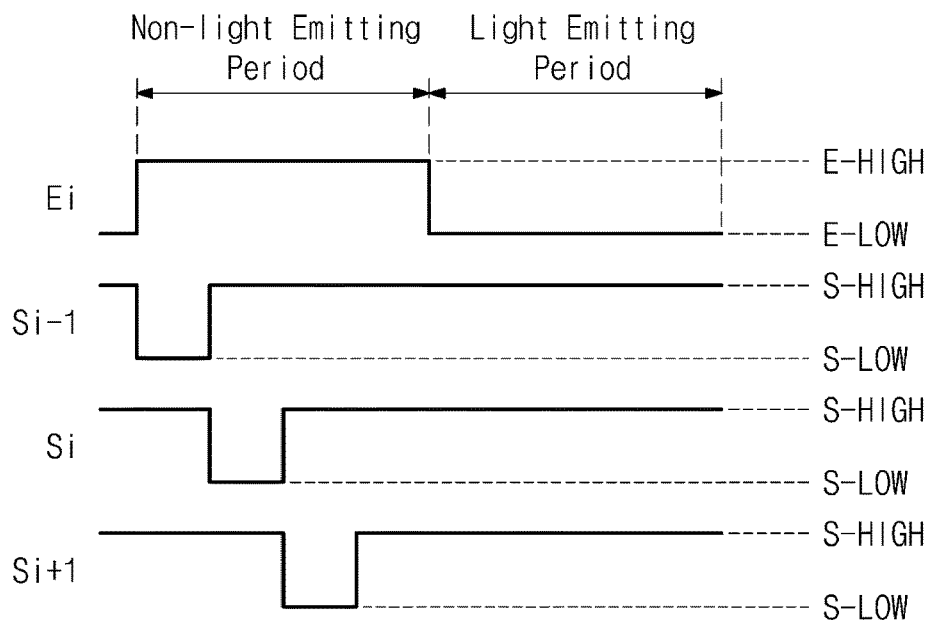
FIG. 7 is a view exemplarily illustrating a light emitting control signal and scan signals, which are applied to the pixel in FIG. 6.

FIG. 6 is an equivalent circuit diagram illustrating the pixel PX according to an embodiment of the inventive concept; and FIG. 7 is a view exemplarily illustrating a light emitting control signal Ei and scan signals Si−1, Si, Si+1, which are applied to the pixel PX in FIG. 6.

In FIG. 6, the pixel PX connected to an i-th scan line SLi and an i-th light emitting control line ECLi is exemplarily illustrated.

The pixel PX may include an organic light-emitting diode OLED and a pixel circuit CC. The pixel circuit CC may include a plurality of transistors T1 to T7 and a capacitor CP. The pixel circuit CC controls a current amount flowing through the organic light-emitting diode OLED in response to the data signal.

The organic light-emitting diode OLED may emit light with luminance (e.g., predetermined luminance) in response to the current amount provided from the pixel circuit CC. To this end, a first power ELVDD may be set to have a level greater than that of a second power ELVSS.

Each of the plurality of transistors T1 to T7 may include an input electrode (or source electrode), an output electrode (or drain electrode), and a control electrode (or gate electrode). In this specification, for convenience, one of the input electrode and the output electrode may be referred to as a first electrode, and the other may be referred to as a second electrode.

A first transistor T1 includes a first electrode connected to the first power ELVDD through a fifth transistor T5 and a second electrode connected to an anode electrode of the organic light-emitting diode OLED through a sixth transistor T6. The first transistor T1 may be referred to as a driving transistor in this specification.

The first transistor T1 controls the current amount flowing through the organic light-emitting diode OLED in response to a voltage applied to the control electrode.

A second transistor T2 is connected between the data line DL and the first electrode of the first transistor T1. Also, a control electrode of the second transistor T2 is connected to the i-th scan line SLi. The second transistor T2 is turned-on when the i-th scan signal Si is provided to the i-th scan line SLi to electrically connect the data line DL and the first electrode of the first transistor T1.

The third transistor T3 is connected between the control electrode and the second electrode of the first transistor T1. A control electrode of the third transistor T3 is connected to the i-th scan line SLi. A third transistor T3 is turned-on when the i-th scan line Si is provided to the i-th scan line SLi to electrically connect the control electrode and the second electrode of the first transistor T1. Accordingly, when the third transistor T3 is turned-on, the first transistor T1 is connected in a diamond form.

A fourth transistor T4 is connected between a node ND and an initialization power generation part (not shown). Also, a control electrode of the fourth transistor T4 is connected to a i−1-th scan line SLi−1. The fourth transistor T4 is turned-on when a i−1-th scan signal Si−1 is provided to the i−1-th scan line SLi−1, and provides an initialization voltage Vint to the node ND.

A fifth transistor T5 is connected between the power line PL and the first electrode of the first transistor T1. A control electrode of the fifth transistor T5 is connected to the i-th light emitting control line ECLi.

A sixth transistor T6 is connected between the second electrode of the first transistor T1 and the anode electrode of the organic light-emitting diode OLED. Also, a control electrode of the sixth transistor T6 is connected to the i-th light emitting control line ECLi.

A seventh transistor T7 is connected between the initialization power generation part (not shown) and the anode electrode of the organic light-emitting diode OLED. Also, a control electrode of the seventh transistor T7 is connected to the i+1-th scan line SLi+1. The seventh transistor T7 is turned-on when the i+1-th scan signal Si+1 is provided to the i+1-th scan line SLi+1, and provides the initialization voltage Vint to the anode electrode of the organic light-emitting diode OLED.

The seventh transistor T7 may improve a black expression capability of the pixel PX. When the seventh transistor T7 is turned-on, a parasitic capacitor (not shown) of the organic light-emitting diode OLED is discharged. Accordingly, the organic light-emitting diode OLED does not emit light due to a leakage current from the first transistor T1 when black luminance is realized, and, thus, the black expression capability may be improved.

In addition, although the control electrode of the seventh transistor T7 is connected to the i+1-th scan line SLi+1 in FIG. 6, embodiments of the inventive concept are not limited thereto. In another embodiment of the inventive concept, the control electrode of the seventh transistor T7 may be connected to the i-th scan line SLi or the i−1-th scan line SLi−1.

Although PMOS is exemplarily illustrated in FIG. 6, embodiments of the inventive concept are not limited thereto. In another embodiment of the inventive concept, the pixel PX may include NMOS. In another embodiment of the inventive concept, the pixel PX may include a combination of NMOS and PMOS.

The capacitor CP is disposed between the power line PL and the node ND. The capacitor CP stores a voltage corresponding to the data signal. According to the voltage stored in the capacitor CP, a current amount flowing through the first transistor T1 when the fifth transistor T5 and the sixth transistor T6 are turned-on may be determined.

Embodiments of the inventive concept are not limited to the structure of the pixel PX in FIG. 6. In another embodiment of the inventive concept, the pixel PX may be realized in any of various types for allowing the organic light-emitting element OLED to emit light.

Referring to FIG. 7, the light emitting control signal Ei may have a high level E-HIGH and a low level E-LOW. Each of the scan signals Si−1, Si, and Si+1 may have a high level S-HIGH or a low level S-LOW.

When the light emitting control signal Ei has the high level E-HIGH, the fifth transistor T5 and the sixth transistor T6 are turned-off. When the fifth transistor T5 is turned-off, the power line PL and the first electrode of the first transistor T1 are electrically cut-off from each other. When the sixth transistor T6 is turned-off, the second electrode of the first transistor T1 and the organic light-emitting element OLED are electrically cut-off from each other. Accordingly, the organic light-emitting element OLED does not emit light while the light emitting control signal Ei having the high level E-HIGH is provided to the i-th light emitting control line ECLi.

Thereafter, when the i−1-th scan signal Si provided to the i−1-th scan line SLi−1 has the low level S-LOW, the fourth transistor T4 is turned-on. When the fourth transistor T4 is turned-on, the initialization voltage Vint is provided to the node ND.

When the i-th scan signal Si provided to the i-th scan line SLi has the low level S-LOW, the second transistor T2 and the third transistor T3 are turned-on.

When the second transistor T2 is turned-on, the data signal is provided to the first electrode of the first transistor T1. Here, since the node ND is initialized to the initialization voltage Vint, the first transistor T1 is turned-on. When the first transistor T1 is turned-on, a voltage corresponding to the data signal is provided to the node ND. Here, the capacitor CP stores the voltage corresponding to the data signal.

When the i+1-th scan signal Si+1 provided to the i+1-th scan line SLi+1 has the low level S-LOW, the seventh transistor T7 is turned-on.

When the seventh transistor T7 is turned-on, the initialization voltage Vint is provided to the anode electrode of the organic light-emitting element OLED, and the parasitic capacitor of the organic light-emitting element OLED is discharged.

When the light emitting control signal Ei provided to the light emitting control line ECLi has the low level E-LOW, the fifth transistor T5 and the sixth transistor T6 are turned-on. When the fifth transistor T5 is turned-on, the first power ELVDD is provided to the first electrode of the first transistor T1. When the sixth transistor T6 is turned-on, the second electrode of the first transistor T1 and the anode electrode of the organic light-emitting element OLED are electrically connected to each other. Then, the organic light-emitting element OLED generates light having luminance (e.g., predetermined luminance) in response to the provided current amount.

Figure 8:
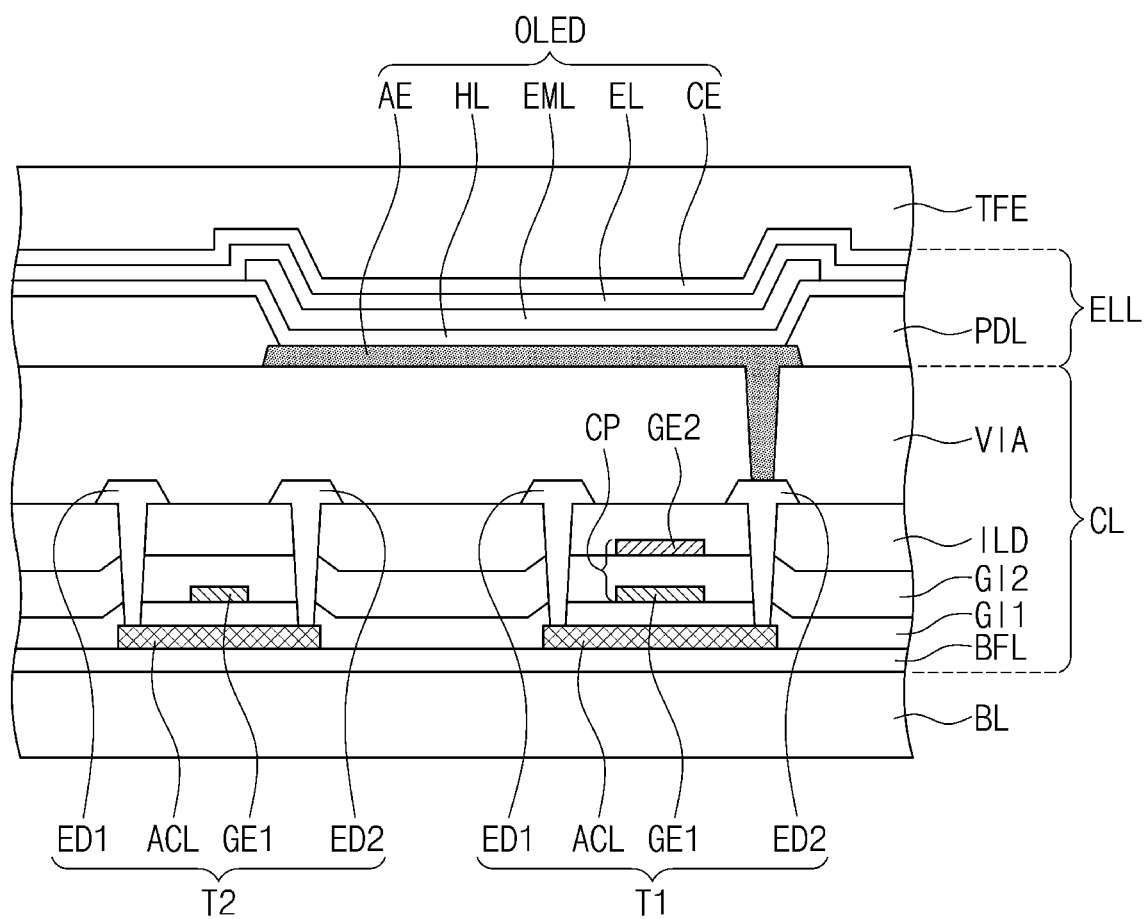
FIG. 8 is a cross-sectional view illustrating a portion of a pixel PX according to an embodiment of the inventive concept.

FIG. 8 is a cross-sectional view illustrating a portion of the pixel PX (refer to FIG. 6) according to an embodiment of the inventive concept. Although the first transistor T1 and the second transistor T2 are exemplarily illustrated in FIG. 8, embodiments of the inventive concept are not limited to the structure of the first transistor T1 and the second transistor T2. Since a cross-sectional shape is illustrated, a second electrode ED2 of the first transistor T1 directly contacts the anode electrode AE of the pixel PX in FIG. 8. However, substantially, the second electrode ED2 may be connected to the anode electrode AE of the pixel PX through the sixth transistor T6 of the first transistor T1 as illustrated in FIG. 6. However, embodiments of the inventive concept are not limited thereto. In another embodiment of the inventive concept, the second electrode ED2 of the first transistor T1 may directly contact the anode electrode AE of the pixel PX.

In an embodiment, the display panel DP (refer to FIG. 5) may include a base layer BL, a circuit layer CL, a light emitting element layer ELL, and an encapsulation layer TFE.

The circuit layer CL may include a buffer layer BFL, gate insulation layers GI1 and GI2, an interlayer insulation layer ILD, and transistors T1 and T2.

The light emitting element layer ELL may include an organic light-emitting element OLED and a pixel defining layer PDL.

The encapsulation layer TFE may seal the light emitting element layer ELL to protect the light emitting element layer ELL from external oxygen or moisture.

The buffer layer BFL is disposed on a surface of the base layer BL.

The buffer layer BFL prevents or substantially prevents foreign substances existing on the base layer BL from being introduced to the pixel PX during a manufacturing process. In particular, the buffer layer BFL prevents or substantially prevents foreign substances from being spread to active parts ACL of the transistors T1 and T2 of the pixel PX.

The foreign substances may be introduced from the outside or generated when the base layer BL is thermally decomposed. Also, the buffer layer BFL may block external moisture from being introduced to the pixel PX.

The active parts ACL of the transistors T1 and T2 are disposed on the buffer layer BFL. In an embodiment, each of the active parts ACL may include polysilicon or amorphous silicon. In an embodiment, each of the active parts ACL may include a metal oxide semiconductor.

The active parts ACL may include a channel region that serves as a passage through which an electron or a hole may move and a first ion doping region and a second ion doping region with the channel region therebetween.

The first gate insulation layer GI1 covering the active parts ACL is disposed on the buffer layer BFL. The first gate insulation layer GI1 includes an organic layer and/or an inorganic layer. In an embodiment, the first gate insulation layer GI1 may include a plurality of inorganic thin-films. In an embodiment, the plurality of inorganic thin-films may include a silicon nitride layer and a silicon oxide layer.

Control electrodes GE1 of each of the transistors T1 and T2 are disposed on the first gate insulation layer GI1. The control electrode GE1 of the first transistor T1 may be one of two electrodes of the capacitor CP. At least a portion of the scan lines SL (refer to FIG. 5) and the light emitting control lines ECL (refer to FIG. 5) may be disposed on the first gate insulation layer GI1.

The second gate insulation layer GI2 covering the control electrodes GE1 is disposed on the first gate insulation layer GI1. The second gate insulation layer GI2 includes an organic layer and/or an inorganic layer. In an embodiment, the second gate insulation layer GI2 may include a plurality of inorganic thin-films. In an embodiment, the plurality of inorganic thin-films may include a silicon nitride layer and a silicon oxide layer.

The other electrode GE2 of the two electrodes of the capacitor CP (refer to FIG. 6) may be disposed on the second gate insulation layer GI2. That is, the capacitor CP in FIG. 6 may be provided by overlapping the electrode GE1 disposed on the first gate insulation layer GI1 and the electrode GE2 disposed on the second gate insulation layer GI2. However, embodiments of the inventive concept are not limited to the above-described structure in which the electrodes of the capacitor CP are disposed.

The interlayer insulation layer ILD covering the electrode GE2 is disposed on the second gate insulation layer GI2. The interlayer insulation layer ILD includes an organic layer and/or an inorganic layer. In an embodiment, the interlayer insulation layer ILD may include a plurality of thin-films. In an embodiment, the plurality of inorganic thin-films may include a silicon nitride layer and a silicon oxide layer.

At least a portion of the data line DL (refer to FIG. 5) and the power line PL (refer to FIG. 5) may be disposed on the interlayer insulation layer ILD. The first electrodes ED1 and the second electrodes ED2 of the transistors T1 and T2 may be disposed on the interlayer insulation layer ILD.

The first electrodes ED1 and the second electrodes ED2 may be connected to the corresponding active parts ACL through through-holes passing through the gate insulation layers GI1 and GI2 and the interlayer insulation layer ILD.

A circuit insulation layer VIA covering the first electrodes ED1 and the second electrodes ED2 is disposed on the interlayer insulation layer ILD. The circuit insulation layer VIA includes an organic layer and/or an inorganic layer. The circuit insulation layer VIA may provide a planarized surface.

The pixel defining layer PDL and the organic light-emitting element OLED are disposed on the circuit insulation layer VIA.

In an embodiment, the organic light-emitting element OLED may include an anode electrode AE, a hole control layer HL, a light emitting layer EML, an electron control layer EL, and a cathode electrode CE.

Figure 9:
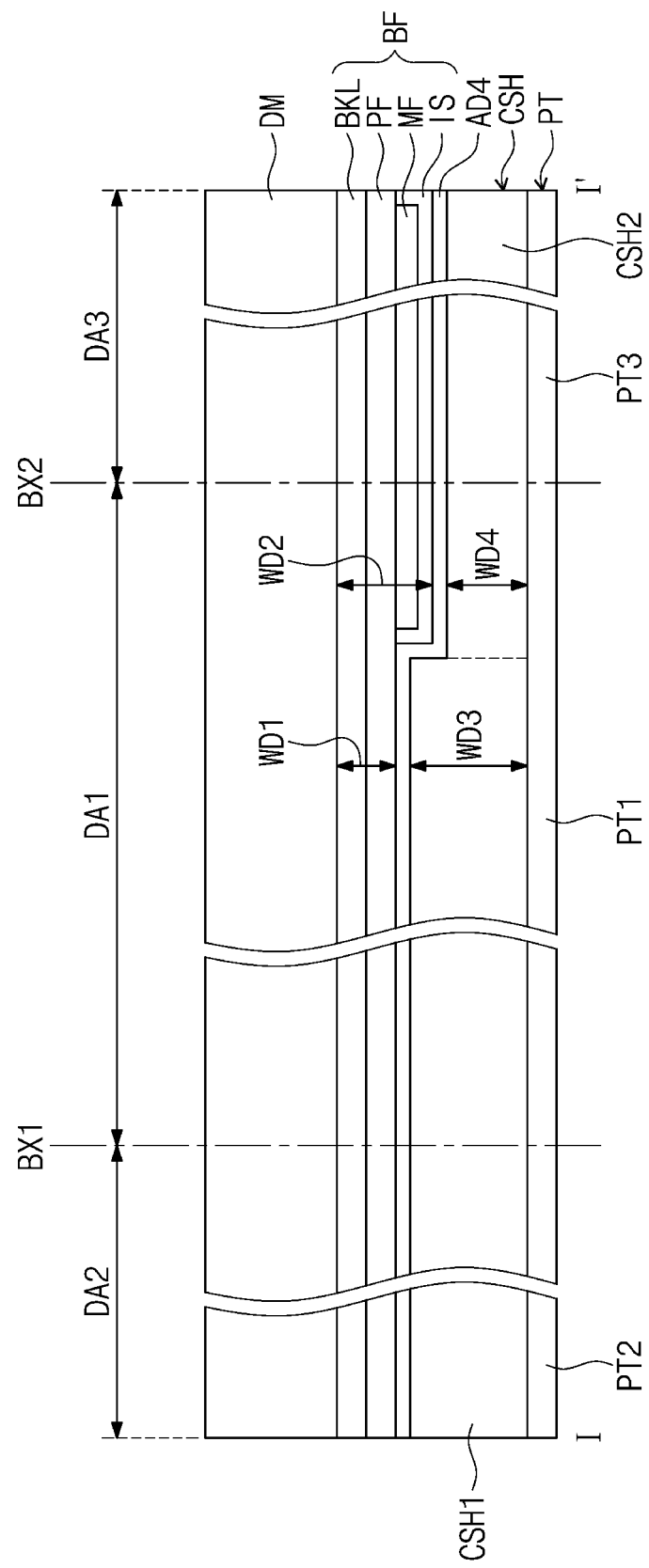
FIGS. 9 and 10 are views each respectively illustrating a cross-section taken along the line I-I' of FIG. 1, according to embodiments of the inventive concept.
Figure 10:
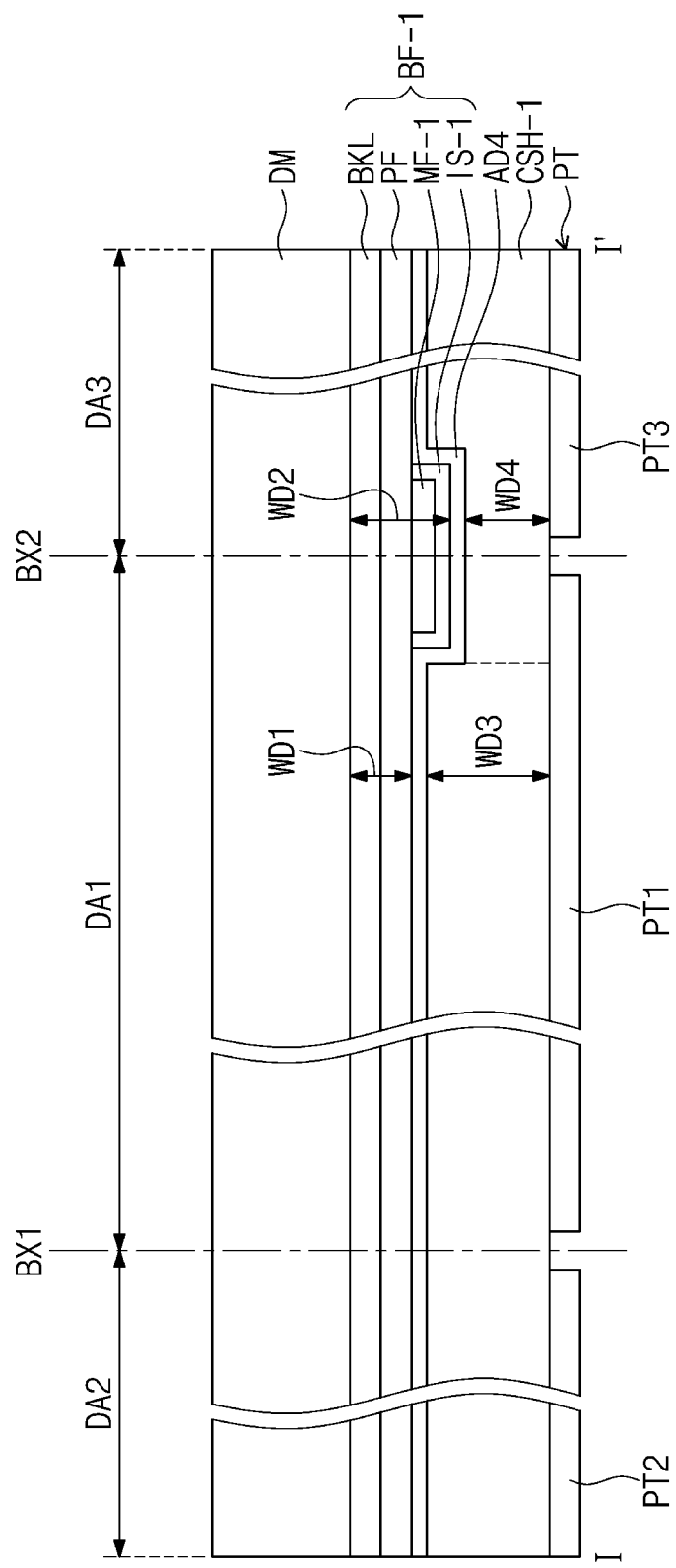

FIGS. 9 and 10 are cross-sectional views each respectively illustrating a portion of a cross-section taken along line I-I' of FIG. 1, according to embodiments of the inventive concept.

Referring to FIG. 9, in an embodiment, the base film BF may include a protection film PF, a complementary film MF, a light blocking layer BKL, and a cover layer IS.

The protection film PF may include a polymer material. For example, the protection film PF may include an acrylate-based material, polyurethane, or polyethylene. However, embodiments of the inventive concept are not limited thereto.

In an embodiment, the protection film PF may have a thickness of about 50 µm or more and about 100 µm or less. When the protection film PF has a thickness less than about 50 µm, the protection film PF may not effectively prevent damage to the display panel DP, and may be difficult to manufacture. When the protection film PF has a thickness greater than about 100 µm, the display device DD may not be easily folded.

The protection film PF overlaps the first display area DA1, the second display area DA2, the third display area DA3, the first bending axis BX1, and the second bending axis BX2.

The complementary film MF is disposed below the protection film PF. The complementary film MF overlaps a portion of the first display area DA1, a portion of the third display area DA3, and the second bending axis BX2 and does not overlap the first bending axis BX1.

The complementary film MF may contact the protection film PF. In an embodiment of the inventive concept, the complementary film MF may be directly applied on the protection film PF.

In an embodiment, the complementary film MF may include a metal. For example, the complementary film MF may include iron, nickel, copper, or stainless.

In an embodiment, the complementary film MF may have a thickness of about 30 μm or more and about 50 μm or less. When the complementary film MF has a thickness less than about 30 μm, the complementary film MF may not secure rigidity sufficient for enduring an applied stress, and may be difficult to manufacture. When the complementary film MF has a thickness greater than about 50 μm, the display device DD may not be easily folded.

The light blocking layer BKL may be disposed between the protection film PF and the display module DM. The light blocking layer BKL may have a black color. The light blocking layer BKL serves to block light such that a user does not recognize a color difference generated between a portion on which the complementary film MF is disposed and a portion on which the complementary film MF is not disposed.

In an embodiment of the inventive concept, the light blocking layer BKL may be directly printed on the protection film PF.

Although the light blocking layer BKL may include carbon in an embodiment of the inventive concept, embodiments of the inventive concept are not limited thereto.

In an embodiment, the light blocking layer BKL may have a thickness of about 5 μm or more and about 8 μm or less. When the light blocking layer BKL has a thickness less than about 5 μm, performance of blocking light may be degraded. When the light blocking layer BKL has a thickness greater than about 8 μm, the display device DD may not be easily folded.

The cover layer IS may be disposed below the complementary film MF to cover the complementary film MF. In an embodiment, since the complementary film MF contains a metal, the complementary film MF may be damaged when exposed to moisture or oxygen. Accordingly, the complementary film MF may be prevented or substantially prevented from being exposed to external moisture or oxygen by using the cover layer IS.

In an embodiment of the inventive concept, the cover layer IS may be applied on a bottom surface of the protection film PF to cover the complementary film MF.

In the base film BF, a portion (herein, referred to as a first portion) on which the complementary film MF is not disposed has a thickness WD1 (herein, referred to as a first thickness) less than a thickness WD2 (herein, referred to as a second thickness) of a portion (herein, referred to as a second portion) on which the complementary film MF is disposed. As described above, since the second thickness WD2 of the second portion is greater than the first thickness WD1 of the first portion, the second portion, which is both in-foldable and out-foldable with respect to the second bending axis BX2, may have a rigidity greater than that of the first portion, which is only in-foldable.

In an embodiment of the inventive concept, the impact absorbing member CSH may include a first impact absorbing member CSH1 overlapping the first bending axis BX1 and a second impact absorbing member CSH2 overlapping the second bending axis BX2.

The first impact absorbing member CSH1 may have a thickness WD3 (herein, referred to as a third thickness) greater than a thickness WD4 (herein, referred to as a fourth thickness) of the second impact absorbing member CSH2.

Since the third thickness WD3 is greater than the fourth thickness WD4, a stepped portion that is generated because the first thickness WD1 is less than the second thickness WD2 may be compensated.

In an embodiment, the support member PT may not overlap the bending axes BX1 and BX2.

The support member PT may include a first support member PT1, a second support member PT2, and a third support member PT3.

The first support member PT1 overlaps the first display area DA1, the second support member PT2 overlaps the second display area DA2, and the third support member PT3 overlaps the third display area DA3.

In an embodiment, since the support members PT1, PT2, and PT3 are spaced apart from each other with respect to the bending axes BX1 and BX2, the display device DD may have improved flexibility when folded.

Referring to FIG. 10, in an embodiment, a base film BF-1 may include a protection film PF, a complementary film MF-1, a light blocking layer BKL, and a cover layer IS-1.

Unlike the complementary film MF in FIG. 9, the complementary film MF-1 in FIG. 10 may be disposed only at a portion corresponding to the second bending axis BX2. That is, the complementary film MF-1 in FIG. 10 is smaller in size than the complementary film MF in FIG. 9.

Correspondingly, the cover layer IS-1 in FIG. 10 is smaller in size than the cover layer IS in FIG. 9.

In an embodiment, the complementary film MF-1 has a length that is at least equal to or greater than about $\pi \times R2$ (where R2 is the second curvature radius, refer to FIG. 2D). In an embodiment, a length from the second bending axis BX2 to the complementary film MF-1 is equal to or greater than about $\frac{1}{2} \times \pi \times R2$.

When the complementary film MF-1 has a length equal to or greater than about $\pi \times R2$, the complementary film MF-1 may not apply a stress to other components when the display device DD is folded.

As described above, in comparison with FIG. 9, the complementary film MF-1 and the cover layer IS-1 are disposed only at a portion corresponding to the second bending axis BX2 to secure rigidity.

In correspondence to the above-described deformation of the complementary film MF-1 and the cover layer IS-1, the impact absorbing member CSH-1 in FIG. 10 is also variously formed as compared with the impact absorbing member CSH in FIG. 9.

Description of other features in FIG. 10, which are substantially the same as those described in FIG. 9, will be omitted.

According to embodiments of the inventive concept, the foldable display device having improved durability may be provided by adding the member for improving rigidity to the portion to which a stress is repeatedly applied.

It will be apparent to those skilled in the art that various modifications and variations can be made in the inventive concept. Thus, it is intended that the present disclosure covers the modifications and variations of this inventive concept within the scope of the claims and their equivalents. Thus, the scope of the present invention is to be determined by the broadest permissible interpretation of the claims and their equivalents, and shall not be restricted or limited by the foregoing detailed description.

What is claimed is:
1. A display device comprising:
a display module that is foldable with respect to a first bending axis and a second bending axis spaced apart from the first bending axis;
a protection film below the display module, overlapping the first bending axis and the second bending axis, and comprising a polymer material; and
a complementary film below the protection film, overlapping only the second bending axis of the first and second bending axes, and comprising a metal, wherein, in an unfolded state of the display module, the protection film is below the display module, and the complementary film is below the protection film.

2. The display device of claim 1, wherein the display device is in-foldable with respect to the first bending axis, and in-foldable and out-foldable with respect to the second bending axis.

3. The display device of claim 2, further comprising a light blocking layer between the display module and the protection film, overlapping the first bending axis and the second bending axis, and having a black color.

4. The display device of claim 3, wherein the light blocking layer contacts the display module and the protection film.

5. The display device of claim 3, further comprising a cover layer below the complementary film to cover the complementary film.

6. The display device of claim 5, further comprising an impact absorbing member below the protection film and having elasticity.

7. The display device of claim 6, wherein the impact absorbing member comprises:
a first impact absorbing member that does not overlap the complementary film and has a first thickness; and
a second impact absorbing member that overlaps the complementary film and has a second thickness less than the first thickness.

8. The display device of claim 7, further comprising an adhesive member configured to couple the first impact absorbing member to the protection film and couple the second impact absorbing member to the cover layer.

9. The display device of claim 7, wherein the display module comprises a first display area, a second display area extending from the first display area, and a third display area extending from the first display area,
the first bending axis is defined between the first display area and the second display area, and the second bending axis is defined between the first display area and the third display area, and
the display device further comprises a support member below the impact absorbing member,
wherein the support member comprises:
a first support member overlapping the first display area;
a second support member overlapping the second display area and being spaced apart from the first support member; and
a third support member overlapping the third display area and being spaced apart from the first support member.

10. The display device of claim 6, wherein the protection film has a thickness of about 50 μm or more and about 100 μm or less, the light blocking layer has a thickness of about 5 μm or more and about 8 μm or less, the complementary film has a thickness of about 30 μm or more and about 50 μm or less, and the cover layer has a thickness of about 3 pm or more and about 5 μm or less.

11. The display device of claim 5, wherein a first curvature radius generated when folded with respect to the first bending axis is less than a second curvature radius generated when folded with respect to the second bending axis.

12. A display device comprising:
a display module on which a plurality of bending axes is defined and which is foldable with respect to each of the plurality of bending axes; and
a base film below the display module,
wherein the base film comprises:
a first portion overlapping a first bending axis of the plurality of bending axes and having a first thickness; and
a second portion overlapping a second bending axis of the plurality of bending axes and having a second thickness greater than the first thickness;
wherein the first portion comprises a first portion of a protection film comprising a polymer material, and
the second portion comprises:
a second portion of the protection film that comprises the polymer material and extends from the first portion of the protection film; and
a complementary film that comprises a metal, does not overlap the first bending axis, and overlaps the second bending axis,
wherein, in an unfolded state of the display module, the protection film is below the display module, and the complementary film is below the protection film.

13. The display device of claim 12, wherein the display device is in-foldable with respect to the first bending axis, and in-foldable and out-foldable with respect to the second bending axis.

14. The display device of claim 12, wherein the base film further comprises a light blocking layer having a black color, and
the light blocking layer is disposed between the first portion of the protection film and the display module and between the second portion of the protection film and the display module.

15. The display device of claim 14, wherein the light blocking layer contacts the display module, the first portion of the protection film, and the second portion of the protection film.

16. The display device of claim 14, further comprising a cover layer disposed below the complementary film to cover the complementary film.

17. The display device of claim 16, further comprising an impact absorbing member disposed below the base film and having a predetermined elastic force.

18. The display device of claim 17, wherein the impact absorbing member comprises:
a first impact absorbing member that does not overlap the complementary film and has a first thickness; and
a second impact absorbing member that overlaps the complementary film and has a second thickness less than the first thickness.

19. The display device of claim 18, further comprising an adhesive member configured to couple the first impact absorbing member to the first portion of the protection film and the second portion of the protection film and couple the second impact absorbing member to the cover layer.

20. The display device of claim 17, wherein the display module comprises a first display area, a second display area extending from the first display area, and a third display area extending from the first display area,
the first bending axis is defined between the first display area and the second display area, and the second bending axis is defined between the first display area and the third display area, and
the display device further comprises a support member disposed below the impact absorbing member,
wherein the support member comprises:
a first support member that overlaps the first display area;
a second support member that overlaps the second display area and is spaced apart from the first support member; and a third support member that overlaps the third display area and is spaced apart from the first support member.

21. The display device of claim 14, wherein a first curvature radius generated when folded with respect to the first bending axis is less than a second curvature radius generated when folded with respect to the second bending axis.

* * * * *

UNITED STATES PATENT AND TRADEMARK OFFICE
CERTIFICATE OF CORRECTION

| | |
|---|---|
| PATENT NO. | : 11,119,537 B2 |
| APPLICATION NO. | : 16/590740 |
| DATED | : September 14, 2021 |
| INVENTOR(S) | : Gyeongho Jeong |

It is certified that error appears in the above-identified patent and that said Letters Patent is hereby corrected as shown below:

In the Claims

Column 15, Line 56, Claim 10     Delete "pm" and Insert --$\mu$m--

Signed and Sealed this
First Day of August, 2023

*Katherine Kelly Vidal*
Katherine Kelly Vidal
*Director of the United States Patent and Trademark Office*